United States Patent
Li et al.

(10) Patent No.: US 7,535,305 B1
(45) Date of Patent: May 19, 2009

(54) QUIESCENT CURRENT DETECTING CIRCUIT FOR CLASS AB AMPLIFIER

(75) Inventors: Ying Tian Li, Singapore (SG); Hong Liang Zhang, Singapore (SG)

(73) Assignee: Marvell International Ltd., Hamilton (BM)

( * ) Notice: Subject to any disclaimer, the term of this patent is extended or adjusted under 35 U.S.C. 154(b) by 63 days.

(21) Appl. No.: 11/741,380

(22) Filed: Apr. 27, 2007

Related U.S. Application Data

(60) Provisional application No. 60/801,275, filed on May 18, 2006.

(51) Int. Cl.
*H03F 1/52* (2006.01)
(52) U.S. Cl. ...................................... 330/298; 330/267
(58) Field of Classification Search .................. 330/267, 330/298; 327/72, 112
See application file for complete search history.

(56) References Cited

U.S. PATENT DOCUMENTS

| | | | | |
|---|---|---|---|---|
| 6,624,671 | B2 * | 9/2003 | Fotouhi | 327/112 |
| 7,075,373 | B2 * | 7/2006 | Briskin et al. | 330/298 |

* cited by examiner

*Primary Examiner*—Robert Pascal
*Assistant Examiner*—Hieu P Nguyen

(57) ABSTRACT

An operational transconductance amplifier is configured with an asymmetric output current capability. When current sunk from the output exceeds a rated load, the normally equal input voltages diverge. A comparator coupled to the OTA inputs senses when the output current drain exceeds the rated load and changes state when the OTA input voltages diverge. When used in conjunction with a current mirror transistor of known proportion, current through an output transistor, such as quiescent current through the output stage of a class A/B amplifier, can be accurately detected. A current source in parallel with the OTA output can be used to offset the current sensing trigger point.

25 Claims, 8 Drawing Sheets

QUIESCENT CURRENT DETECTING CIRCUIT FOR CLASS AB AMPLIFIER

RELATED APPLICATION

This application claims priority to U.S. Provisional Application 60/801,275, filed May 18, 2006.

BACKGROUND

Measuring current, especially without undue interference in a circuit, can be problematic. The use of series resistors to measure a voltage drop corresponding to current creates a power loss of itself and can limit performance in a circuit. For example, in a class A/B amplifier circuit where rail-to-rail amplification is an important characteristic, the use of a resistor in series with the output drivers for measuring quiescent current may interfere with rail-to-rail operation.

Current measuring techniques are further complicated when the circuit under test is incorporated in a semiconductor. Probing a node internal to a semiconductor, even in a test environment, may be difficult or impossible, given fine line widths and chip passivation. Even when an internal node is successfully probed, the impedance of the probe itself is likely to alter the performance of the circuit under test.

Beyond current measurement issues, attempts to set a known quiescent current in a semiconductor integrated circuit can be complex due to variability that is difficult to predict or control. For example, in a class A/B amplifier circuit, quiescent current may be proportional to current through a biasing circuit, but even when gates in the bias and output driver circuits are drawn in a given W/L proportion, low activation voltages in the power output driver transistors may cause the W/L to shift significantly, and unpredictably, in the presence of quiescent bias voltages. Thus, the initial known relationship between the bias circuit and driver circuit becomes unknown and the quiescent current through the drivers is virtually impossible to predict over a range of operating voltages and semiconductor process variability.

FIG. 1 illustrates a prior art embodiment of a class A/B amplifier. In the following discussion, transistors designated MP are PMOS devices and transistors designated MN are NMOS devices. Class A/B amplifiers are widely used in circuits that need to minimize cross-over distortion, such as audio amplifiers and voice coil motors (VCM) in hard disc drives. Two characteristics make class A/B amplifiers very popular. The first characteristic is low cross-over distortion, that is, a smooth transition from negative voltage to positive voltage. The second characteristic is rail-to-rail output driving capability, i.e. the output can drive from very nearly VDD to very nearly ground. To realize both high drive capability and low cross-over distortion, the quiescent current, that is, standby current with no output signal present, should be well defined. Therefore, it is important to detect and control the quiescent current accurately in class A/B amplifier design.

The circuit 100 of FIG. 1 is suitable for use in driving a load 102 such as a VCM. The V+ and V− inputs differentially drive buffer circuits MN1/MN2/MN3/MN4 and MP3/MP4/MP7/MP8. The buffer circuit outputs on drive nodes ngate and pgate drive the gates of power transistors MN0 and MP0, respectively. When sourcing current, Ip, through load 102, current through output driver MP0 is Iq+Ip. When sinking current, In, from load 102, current through the output driver MN0 is Iq+In. When there is no current through the load 102, the current through both MP0 and MN0 is Iq. The total quiescent current of the circuit 100 is slightly more than the quiescent current through transistors MP0 and MN0, but the difference is negligible and is not included in this discussion. Quiescent current (Iq) is set by matching transistor pairs MN9/MN0 and MP9/MP0 and matching bias currents Ibias 202 and Ibias 204, according to the formula:

$$I_q = I_{bias}\frac{(W/L)_{MP0}}{(W/L)_{MP9}} = I_{bias}\frac{(W/L)_{MN0}}{(W/L)_{MN9}}$$

In one exemplary embodiment, Ibias is set to 20 uA and the W/L ratio (ratio of gate width to length, roughly equivalent to gain) is 100. Quiescent current is then:

$Iq = 20 \text{ uA} * 100 = 2 \text{ mA}$.

The feedback loop through MP5/MP6 keep the gate of MP9 at the same voltage as the gate of MP0 since both pgate and n8 are one diode drop above pbias. Similarly, the feedback loop through MN5/MN7 keep the gate of MN9 at the same voltage as the gate of MN0 because both ngate and n7 are one diode drop below nbias. MN0 and MP0 are drawn with minimum channel lengths to reduce on resistance and increase performance of the output. However, minimum channel length devices are susceptible to channel length narrowing due to Vds voltage. When MN0 and MP0 have high Vds voltages compared to MN9 and MP9, an effective W/L mismatch may develop, causing quiescent current to vary from the design goal. For example, in a typical application, VDD may be 12V and with no load current, the voltage at Aout will be 6 volts. The 6 volt Vds can cause a mismatch between the effective W/L of MN0 and MP0 compared to the W/L of their respective paired transistors MN9 and MP9, making quiescent current difficult, if not impossible, to predict. Process variation and temperature can further exaggerate this effect.

Table 1 shows a range of quiescent current in a class AB driver stage over representative process corners for a single set of ideal conditions of Iq_ideal=2 mA, VDD=12V, Aout=6V.

TABLE 1

| Corner/Temp | −20 | 25 | 125 |
| --- | --- | --- | --- |
| TT | 4.49 mA | 4.43 mA | 4.39 mA |
| SS | 3.24 mA | 3.26 mA | 3.31 mA |
| FF | 8.53 mA | 8.05 mA | 7.36 mA |

In spite of this variability, it is often desirable, if not crucial, to set quiescent current to a known value. For example, in a class A/B amplifier circuit, optimal drive and crossover distortion may be achieved only when quiescent current is tightly controlled. In order to control quiescent current, it first must be accurately measured.

SUMMARY

A circuit for measuring current uses an operational transconductance amplifier (OTA) and a comparator to compare an output driver quiescent current to a known current present in the OTA. A mirror of current to be measured is set up using a first transistor coupled to and proportional to the output driver carrying the current under test. The first transistor is also coupled to the output of the OTA. When the mirror current exceeds the OTA's ability to source current, an internal feedback circuit that keeps the OTA input voltages equal fails and the input voltages diverge. The comparator measures the divergence and changes state when the divergence reaches a threshold.

Because the maximum current the OTA can source is known, the point at which the comparator changes state is an accurate indicator of the output driver quiescent current. A current source in series with the first transistor allows setting the comparator threshold by supplementing the current sourcing capability of the OTA.

Known sources of measurement error can be used to develop a margin of error for the measurement.

DETAILED DESCRIPTION

Although the following text sets forth a detailed description of numerous different embodiments, it should be understood that the legal scope of the description is defined by the words of the claims set forth at the end of this disclosure. The detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims.

It should also be understood that, unless a term is expressly defined in this patent using the sentence "As used herein, the term '_' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. § 112, sixth paragraph.

Figure 1:
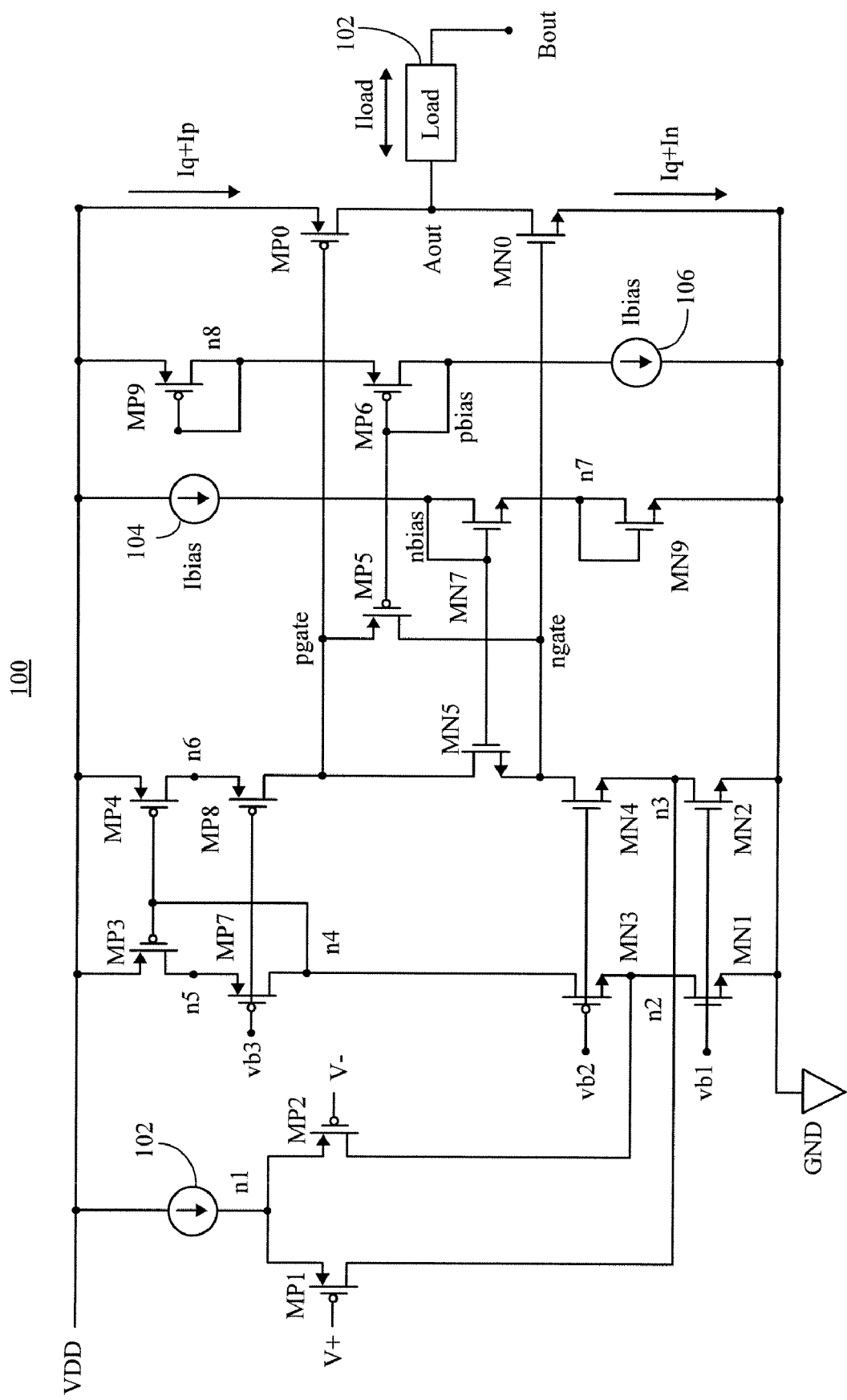
FIG. 1 is a circuit diagram of a prior art class A/B amplifier in a typical application.
Figure 2:
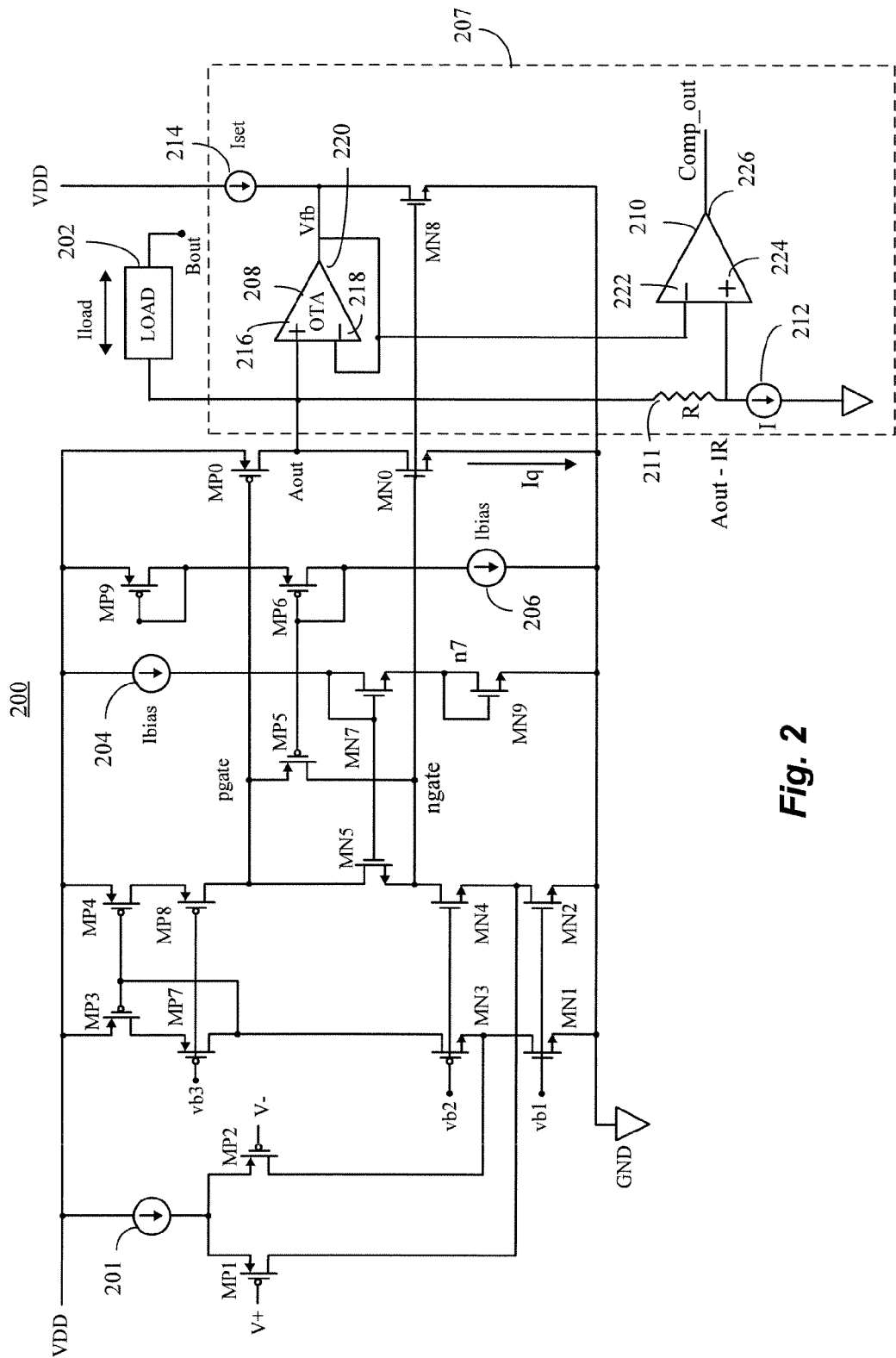
FIG. 2 is a circuit diagram of a current sensing apparatus coupled to the class A/B amplifier of FIG. 1.

FIG. 2 is a circuit diagram of a circuit 200 including the class A/B amplifier of FIG. 1 coupled to a load 202. The circuit 200 includes the elements of FIG. 1, including current source 201 and output drivers MN0 and MP0 for sinking and sourcing current through load 202. Matched Ibias current sources 204 and 206 set the quiescent current (Iq) for the output drivers MN0 and MP0 in ratio of MN9/MN0 and MP9/MP0 as discussed above.

The circuit 200 also includes a circuit 207 to facilitate sensing a quiescent current of an output stage of the class A/B amplifier. The circuit 207 includes an operational transconductance amplifier (OTA) 208 having a non-inverting input 216 coupled to Aout, the output node of the class A/B amplifier. The OTA 208 also includes an inverting input 218 coupled to its own output 220, node Vfb, in a standard feedback mode. Transistor MN8 is coupled to the OTA output 220 and to ground. The gate of MN8 is connected to the gate of MN0. Transistors MN8 and MN0 are drawn so that current through the output transistor MN0 is proportional to current through MN8 in the ratio of $$\frac{(W/L)_{MN0}}{(W/L)_{MN8}}$$

(hereinafter "B"). Thus, the current flowing through MN8 will be Iq/B.

The circuit 207 also includes a comparator 210, coupled to the inputs 216, 218 of the OTA 208 to allow comparison of the voltages on those inputs. An inverting input 222 of the comparator 210 is coupled to the inverting input 218 of the OTA and a non-inverting input 224 of the comparator 210 is coupled to the non-inverting input 216 of the OTA 208. The circuit 207 further includes a resistor 211 and a current source 212 which provide an offset voltage and which are discussed in further detail below. Still further, the circuit 207 includes a current source 214, which may be used to provide an offset current for use in changing a trigger point of a current sensing function of the circuit 207 which will also be discussed in more detail below.

As discussed above, measuring current accurately can be difficult because most standard techniques require current measurement circuitry which ultimately affects the performance of the circuit being measured. In operation, the current measurement circuitry 207 of FIG. 2 may be used to measure current in a variety of applications. In this exemplary embodiment, the measurement is of quiescent current through the output drivers MP0 and MN0 of the class A/B amplifier. This measurement is accomplished with minimal interference in circuit performance. MN0 and MN8 are both driven from the ngate node. Because these two transistors have proportional gate W/L features and are subjected to the same Vds channel narrowing influences, the current through MN0 and MN8 will be proportional through a wide range of operating conditions and semiconductor process variations. Thus, identification of current through MN8 will allow accurate identification of the current through MN0.

The OTA output 220 coupled to node Vfb has an asymmetric current handling capability. That is, it can sink current over a substantial range but can source current only to a well defined limit. As discussed with respect to FIG. 3, when the limit, or rated, amount of current is drawn from the OTA, internal feedback circuits that normally keep the non-inverting input 216 and inverting input 218 at nearly equal voltages cease to function properly and the voltages at the inputs 216, 218 diverge. As described below, when the voltages at the inputs 216, 218 of the OTA diverge, the output 226 of the comparator 210 will eventually change states.

If the comparator inputs 222, 224 were coupled directly to the OTA inputs 216, 218, the nearly identical voltages on the OTA inputs 216, 218 might cause erratic state changes on the comparator output, given drifts and minor voltage changes. Thus, the resistor 211 and current source 212 provide a voltage offset, so that a voltage on the non-inverting input 224 of the comparator 210 is I*R lower than the voltage at the non-inverting input 216 of the OTA 208. Only when the voltage on the inverting input 218 of the OTA 208 is more than I*R lower than the non-inverting input 216 of the OTA 208, will the comparator change output states.

With current source 214 off, so that Iset=0, the comparator 210 will change output states when the current through MN8 causes the limit amount of current to be drawn from the output 220 of the OTA 208. The limit amount of current that can be drawn from the OTA 208 may be set internally in OTA 208, as will be discussed in more detail below. In one embodiment, quiescent current through the output driver transistor MN0 (Iq) may be varied and the limit amount of current from the OTA 208 may be set to trigger the current measurement circuitry 207 when Iq reaches a desired level.

In another embodiment, current Iset from current source 214 may be added. The amount of current through MN8 required to cause the OTA 208 to 'starve' and cause the comparator 210 to change state may be defined as $I_{Threshold}$=Iset+$I_{max}$ OTA. Since current through MN8 is directly proportional to current through MN0, the range of quiescent current through the driver stage of the class A/B amplifier may be detected across a wide range by adjusting the set point of Iset.

By selectively changing Iset until the comparator state changes, the quiescent current of the output stage, that is, MN0, can be accurately detected. Alternatively, the Iset current can be fixed and the quiescent current through MN0 varied until the comparator state changes. This current detection process is accomplished by adding essentially only two high impedance inputs, OTA non-inverting 216 and comparator non-inverting 224, that have a minimal impact on amplifier circuit performance and function without creating an imbalance between high and low side drive states of the class A/B amplifier output stage.

Figure 3:
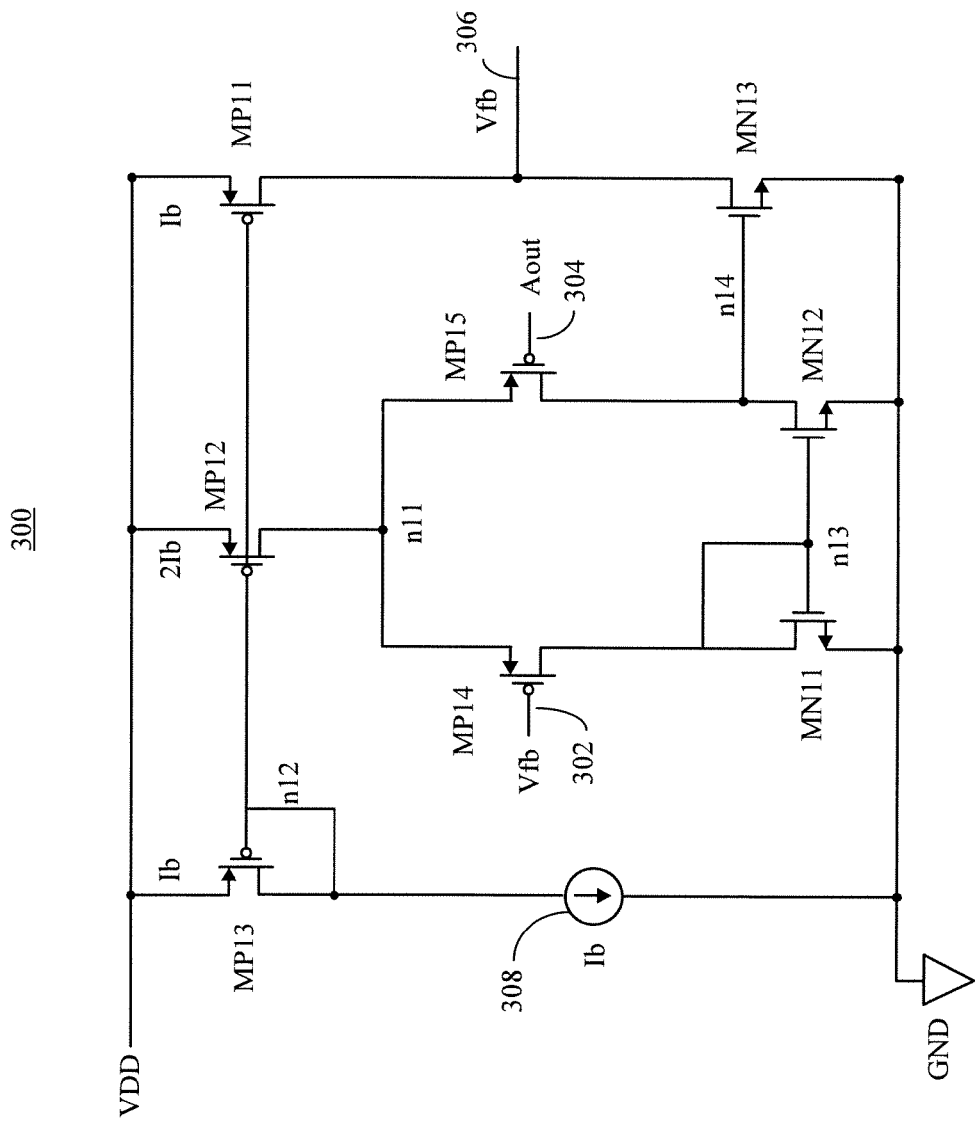
FIG. 3 is a circuit diagram of the OTA of FIG. 2.

FIG. 3, a representative circuit diagram of the operational transconductance amplifier (OTA) 300 the same as, or similar to, the OTA of FIG. 2 is discussed and described. The OTA 300 has inputs 302 and 304, shown here as connected to Vfb and Aout of the circuit of FIG. 2. The inputs 302, 304 are coupled to the gates of input transistors MP14 and MP15, respectively. The sources of input transistors MP14 and MP15 are coupled to the drain of MP12, which is part of a current mirror circuit that includes MP11, MP13 and a current source 308. Transistor MP13 acts as a diode connected to current source 308, and the current source 308 is set to deliver current Ib. Transistor MP12 is scaled to deliver current 2*Ib. Transistor MP11 is scaled to deliver current Ib, equal to that of the current source 308. Current through each input transistor MP14 and MP15 are sunk through transistors MN11 and MN12 respectively. MN11 and MN12 also act as a current mirror.

Referring now to FIGS. 2 and 3, if Iq/B<Iset, the net current Iset−Iq/B will flow into the OTA 300, through transistor MN13. Because of the high open-loop gain of the OTA 300, the OTA 300 will keep Vfb equal to Aout. Because Vfb is equal to Aout, Vfb>Aout−IR. Thus the output of comparator 210 will be 0.

On the other hand, if Iq/B>Iset, the net current Iq/B—Iset may be supplied by the OTA 300. In particular, transistor MP11 may provide the net current from VDD. Because transistor MP11 acts as a current source, however, it can only supply a maximum current of Ib. If Iq/B>Iset+Ib, all current from transistor MP11 will flow out of the OTA 300, and no current will flow through transistor MN13. In this case, Vfb will fall, resulting in Vfb<Aout, and causing the output of the comparator 210 to be 1.

By taking advantage of the asymmetric current sinking and sourcing characteristics of the OTA 300 and by intentionally drawing enough current from the output 306 to 'starve' transistor MN13, the output of the comparator 210 can be caused to change states at point related to the quiescent current. In particular, the current Iset can be incremented or decremented until the change at the output of the comparator 210 is observed. When the output of the comparator 210 changes state between 0 and 1, this indicates that Iset is approximately equal to Iq/B−Ib. If Iset, Ib and B are known, an approximate value of Iq can be determined according to the equation Iq=(Iset+Ib)*B. For example, if Iq represents the quiescent current in MN0, B is the ratio of W/L for MN0 and MN8 and equals 100, Iset=40 uA and Ib=10 uA, then:

$$Iq=(Iset+Ib)*B=(40\,uA+10\,uA)*100=5\,mA$$

A certain degree of error exists in the circuitry due to voltage drop I*R and the input offsets of the OTA 208 and the comparator 210. The error is represented by the equations:

$$V_{error}=IR+V_{offset}$$

$$I_{error} = \frac{Verror}{Rds\_NM8} \times 8$$

In one simulated embodiment, the minimum value resistance drain to source (Rds) of MN8 is 50KΩ. If I*R is set to 100 mV and Voffset=10 mV, the error voltage and resulting error current are approximately:

$$I_{error} = \frac{110\,mV}{50\,K} \times 100 = 0.22\,mA$$

$$Error = \frac{I_{error}}{I_q} \times 100\% = \frac{0.22\,mA}{5\,mA} \times 100\% = 4.4\%$$

Figure 4:
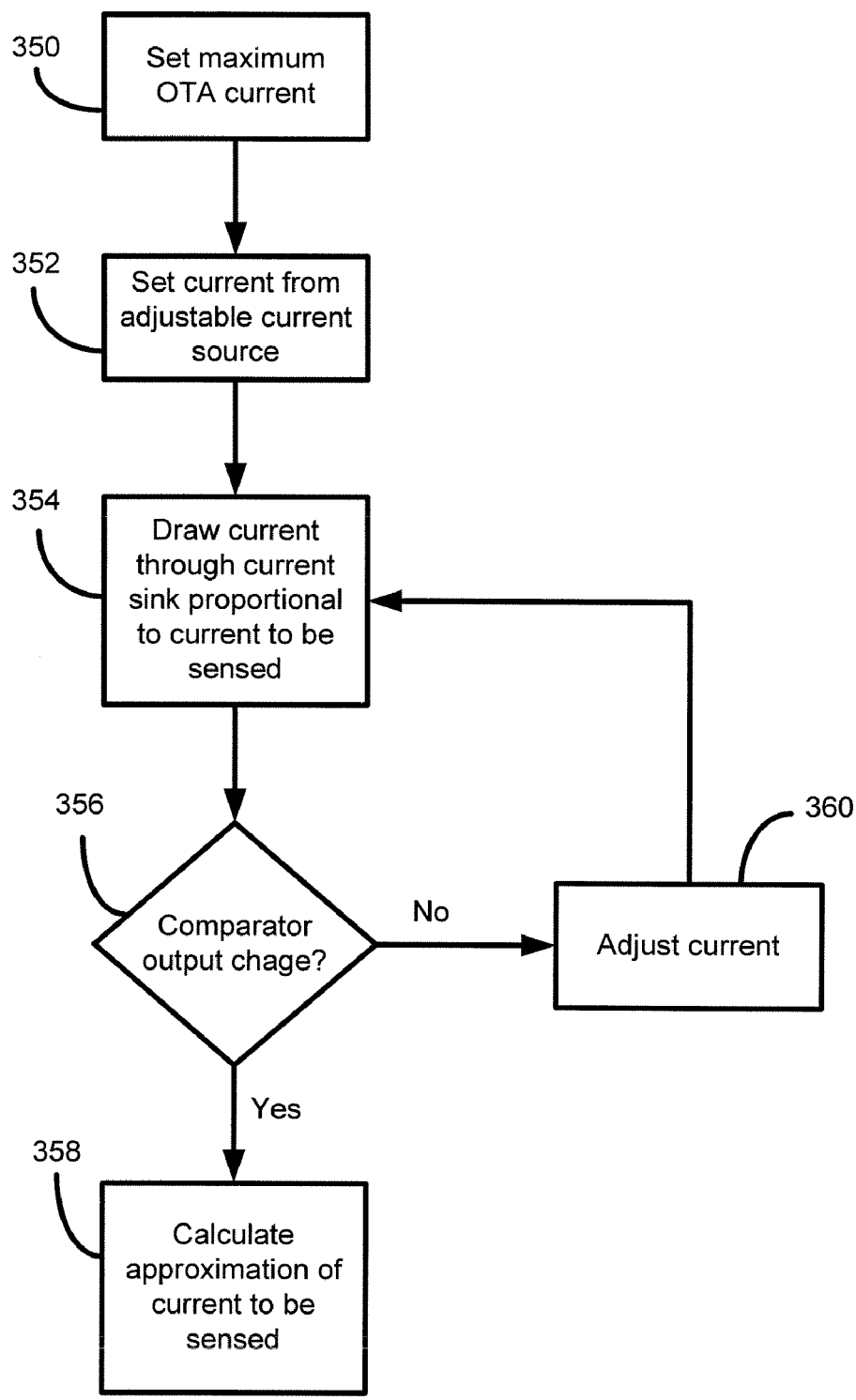
FIG. 4. is a flow chart of a method of operating the current sensing apparatus of FIG. 2.

FIG. 4, a flow chart of a method of operating a current sensing device is discussed and described. At block 350, the maximum current output from OTA 220/300 may be set, for example, by design of the current source 308 of FIG. 3. Since the current through device MP11 is proportional to that of current source 308, the maximum current from OTA 220/300 may be controlled. At block 352, the current from a supplemental current source, such as, current source 214 of FIG. 2 may be set. This current may be fixed at design time or may be variable using known techniques. The current through transistor MN8 is equal to current from the OTA 220 (Ib) added to the current from current source 214 (Iset). The current through MN8 also is proportional to the current to be sensed, in this example, current Iq in transistor MN0, as described at block 354.

At block 356, the output 226 of the comparator 210 is observed. If the current through MN8 causes the maximum output current of the OTA 208 to be drawn, the comparator output 226 will change state. If the comparator output 226 changes state, e.g. goes from 0 to 1, the 'yes' branch from block 356 may be taken to block 358. At block 358, the approximation of the current to be sensed can be calculated. In the exemplary embodiment, the current to be sensed is the current through MN0 (Iq). The value may be determined using the formula Iq=(Ib+Iset)*B, where Ib, Iset and B are known.

When the comparator output at block 356 does not change, the 'no' branch from block 356 may be followed to block 360. At block 360, the either the current at the output 220 of the OTA 208 may be varied and the process repeated at block 354. Changing the current at the output 220 may be accomplished by changing the current output of current source 214. In one embodiment, the current from current source 214 may be started at a high value and decremented until the comparator output 226 changes state. If the current from the current source 214 is more than the current through MN8, the excess current will be sunk through the output 220 of the OTA 208. As the current from source 214 is decremented and becomes less than that through MN8, current will begin to source from the output 220 of the OTA 208. As the current from source 214 is decremented even further, the demand for current from the OTA will exceed its ability to supply the requested current, causing the voltage at output 220 to sag, triggering the comparator.

Another way to change the current at the output 220 of the OTA 208 is to maintain the current from source 214 and vary the quiescent current through the output device MN0 by adjusting current sources 204, 206. When the current through MN0 causes the mirrored current through MN8 to exceed the available supply, the same effect on the OTA 208 occurs and the comparator changes state.

Figure 5B:
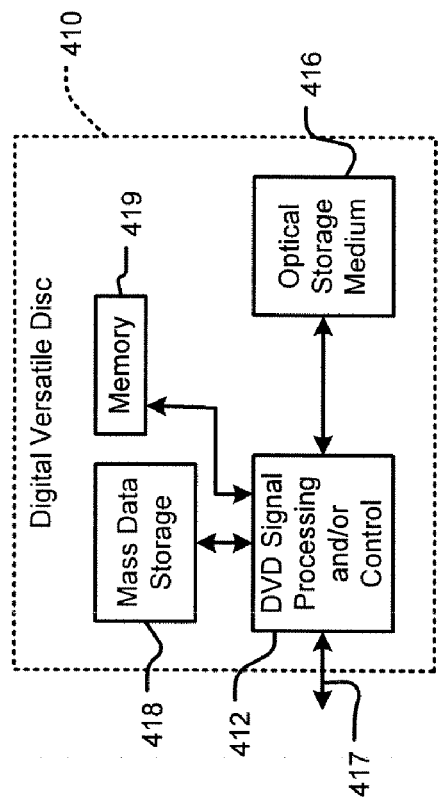
FIG. 5B is a block diagram of a DVD disk drive that may incorporate the quiescent current detecting circuit.
Figure 5A:
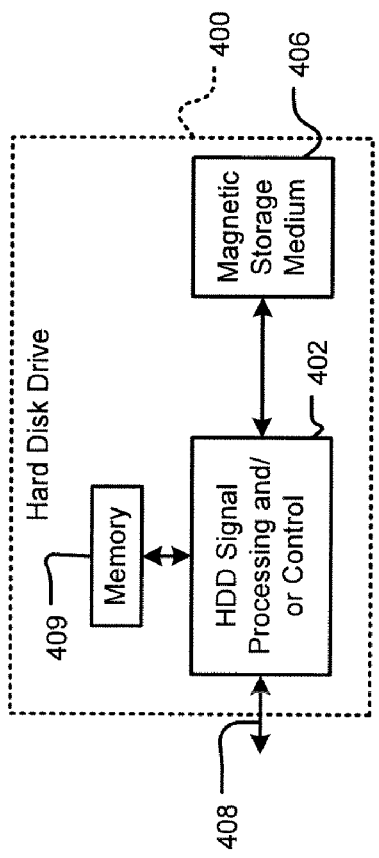
FIG. 5A is a block diagram of a hard disk drive that may incorporate the quiescent current detecting circuit.

Referring now to FIGS. 5A-5G, various exemplary implementations of the present invention are shown. Referring to FIG. 5A, the present invention may be embodied in a hard disk drive 400. The present invention may implement either or both signal processing and/or control circuits, which are generally identified in FIG. 5A at 402. In some implementations, signal processing and/or control circuit 402 and/or other circuits (not shown) in HDD 400 may process data, perform coding and/or encryption, perform calculations, and/or format data that is output to and/or received from a magnetic storage medium 406.

HDD 400 may communicate with a host device (not shown) such as a computer, mobile computing devices such as personal digital assistants, cellular phones, media or MP3 players and the like, and/or other devices via one or more wired or wireless communication links 408. HDD 400 may be connected to memory 409, such as random access memory (RAM), a low latency nonvolatile memory such as flash memory, read only memory (ROM) and/or other suitable electronic data storage.

Referring now to FIG. 5B, the present invention may be embodied in a digital versatile disc (DVD) drive 410. The present invention may implement either or both signal processing and/or control circuits, which are generally identified in FIG. 5B at 412, and/or mass data storage 418 of DVD drive 410. Signal processing and/or control circuit 412 and/or other circuits (not shown) in DVD 410 may process data, perform coding and/or encryption, perform calculations, and/or format data that is read from and/or data written to an optical storage medium 416. In some implementations, signal processing and/or control circuit 412 and/or other circuits (not shown) in DVD 410 can also perform other functions such as encoding and/or decoding and/or any other signal processing functions associated with a DVD drive.

DVD drive 410 may communicate with an output device (not shown) such as a computer, television or other device via one or more wired or wireless communication links 417. DVD 410 may communicate with mass data storage 418 that stores data in a nonvolatile manner. Mass data storage 418 may include a hard disk drive (HDD) such as that shown in FIG. 5A. The HDD may be a mini HDD that includes one or more platters having a diameter that is smaller than approximately 1.8". DVD 410 may be connected to memory 419, such as RAM, ROM, low latency nonvolatile memory such as flash memory, and/or other suitable electronic data storage.

Figure 5D:
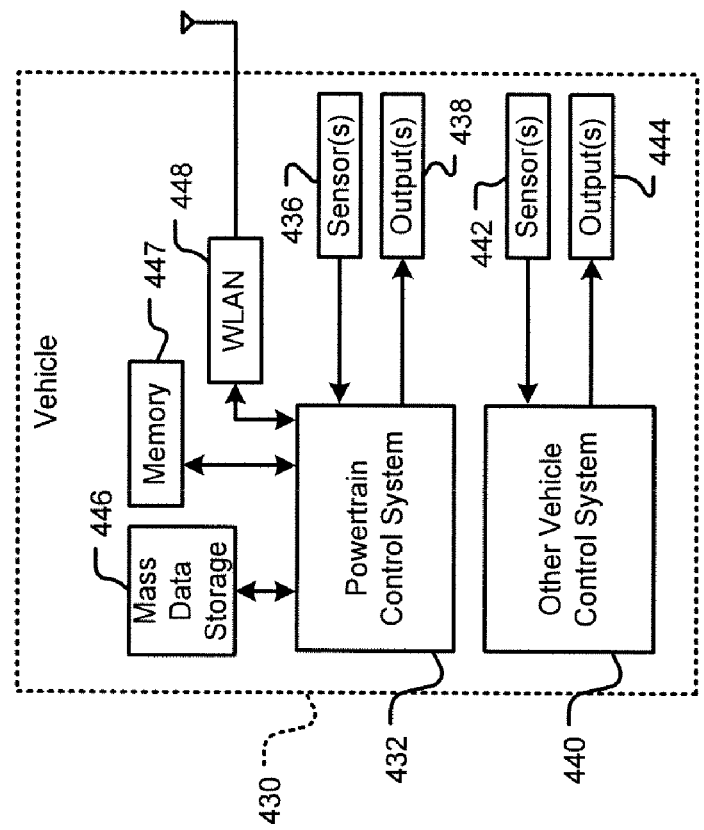
FIG. 5D is a block diagram of a vehicle that may incorporate the quiescent current detecting circuit.
Figure 5C:
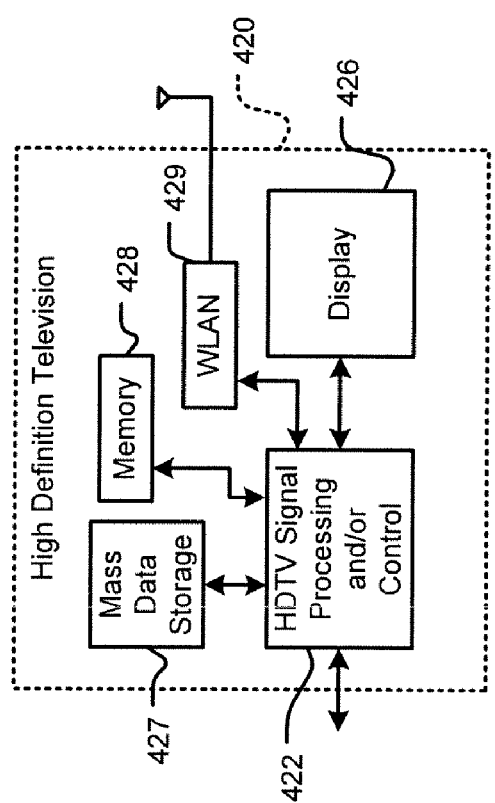
FIG. 5C is a block diagram of a high definition television that may incorporate the quiescent current detecting circuit.

Referring now to FIG. 5C, the present invention may be embodied in a high definition television (HDTV) 420. The present invention may implement either or both signal processing and/or control circuits, which are generally identified in FIG. 5C at 422, a WLAN interface and/or mass data storage of the HDTV 420. HDTV 420 receives HDTV input signals in either a wired or wireless format and generates HDTV output signals for a display 426. In some implementations, signal processing circuit and/or control circuit 422 and/or other circuits (not shown) of HDTV 420 may process data, perform coding and/or encryption, perform calculations, format data and/or perform any other type of HDTV processing that may be required.

HDTV 420 may communicate with mass data storage 427 that stores data in a nonvolatile manner such as optical and/or magnetic storage devices. At least one HDD may have the configuration shown in FIG. 5A and/or at least one DVD may have the configuration shown in FIG. 5B. The HDD may be a mini HDD that includes one or more platters having a diameter that is smaller than approximately 1.8". HDTV 420 may be connected to memory 428 such as RAM, ROM, low latency nonvolatile memory such as flash memory and/or other suitable electronic data storage. HDTV 420 also may support connections with a WLAN via a WLAN network interface 429.

Referring now to FIG. 5D, the present invention implements a control system of a vehicle 430, a WLAN interface and/or mass data storage of the vehicle control system. In some implementations, the present invention implements a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 440 of vehicle 430. Control system 440 may likewise receive signals from input sensors 442 and/or output control signals to one or more output devices 444. In some implementations, control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 432 may communicate with mass data storage 446 that stores data in a nonvolatile manner. Mass data storage 446 may include optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". Powertrain control system 432 may be connected to memory 447 such as RAM, ROM, low latency nonvolatile memory such as flash memory and/or other suitable electronic data storage. Powertrain control system 432 also may support connections with a WLAN via a WLAN network interface 448. The control system 440 may also include mass data storage, memory and/or a WLAN interface (all not shown).

Figure 5E:
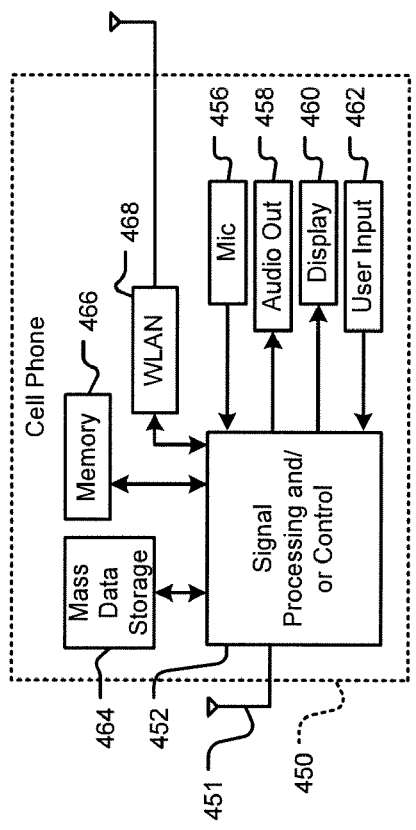
FIG. 5E is a block diagram of a cellular telephone that may incorporate the quiescent current detecting circuit.

Referring now to FIG. 5E, the present invention may be embodied in a cellular phone 450 that may include a cellular antenna 451. The present invention may implement either or both signal processing and/or control circuits, which are generally identified in FIG. 5E at 452, a WLAN interface and/or mass data storage of the cellular phone 450. In some implementations, cellular phone 450 includes a microphone 456, an audio output 458 such as a speaker and/or audio output jack, a display 460 and/or an input device 462 such as a keypad, pointing device, voice actuation and/or other input device. Signal processing and/or control circuits 452 and/or other circuits (not shown) in cellular phone 450 may process data, perform coding and/or encryption, perform calculations, format data and/or perform other cellular phone functions.

Cellular phone 450 may communicate with mass data storage 464 that stores data in a nonvolatile manner such as optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". Cellular phone 450 may be connected to memory 466 such as RAM, ROM, low latency nonvolatile memory such as flash memory and/or other suitable electronic data storage. Cellular phone 450 also may support connections with a WLAN via a WLAN network interface 468.

Figure 5F:
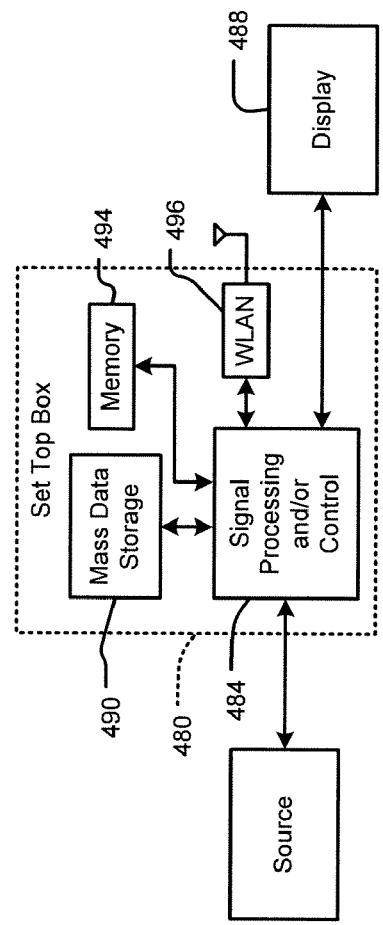
FIG. 5F is a block diagram of a television set top box that may incorporate the quiescent current detecting circuit.

Referring now to FIG. 5F, the present invention may be embodied in a set top box 480. The present invention may implement either or both signal processing and/or control circuits, which are generally identified in FIG. 5F at 484, a WLAN interface and/or mass data storage of the set top box 480. Set top box 480 receives signals from a source such as a broadband source and outputs standard and/or high definition audio/video signals suitable for a display 488 such as a television and/or monitor and/or other video and/or audio output devices. Signal processing and/or control circuits 484 and/or other circuits (not shown) of the set top box 480 may process data, perform coding and/or encryption, perform calculations, format data and/or perform any other set top box function.

Set top box 480 may communicate with mass data storage 490 that stores data in a nonvolatile manner. Mass data storage 490 may include optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". Set top box 480 may be connected to memory 494 such as RAM, ROM, low latency nonvolatile memory such as flash memory and/or other suitable electronic data storage. Set top box 480 also may support connections with a WLAN via a WLAN network interface 496.

Figure 5G:
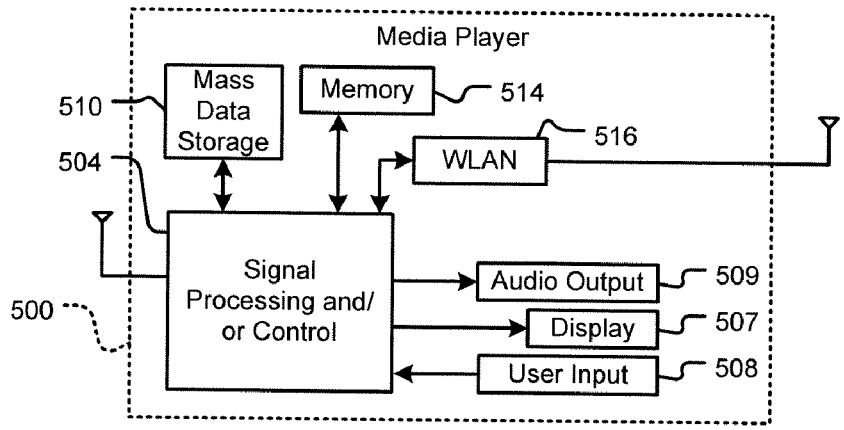
FIG. 5G is a block diagram of a media player that may incorporate the quiescent current detecting circuit.

Referring now to FIG. 5G, the present invention may be embodied in a media player 500. The present invention may implement either or both signal processing and/or control circuits, which are generally identified in FIG. 5G at 504, a WLAN interface and/or mass data storage of the media player 500. In some implementations, media player 500 includes a display 507 and/or a user input 508 such as a keypad, touchpad and the like. In some implementations, media player 500 may employ a graphical user interface (GUI) that typically employs menus, drop down menus, icons and/or a point-and-click interface via display 507 and/or user input 508. Media player 500 further includes an audio output 509 such as a speaker and/or audio output jack. Signal processing and/or control circuits 504 and/or other circuits (not shown) of media player 500 may process data, perform coding and/or encryption, perform calculations, format data and/or perform any other media player function.

Media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". Media player 500 may be connected to memory 514 such as RAM, ROM, low latency nonvolatile memory such as flash memory and/or other suitable electronic data storage. Media player 500 also may support connections with a WLAN via a WLAN network interface 516. Still other implementations in addition to those described above are contemplated.

Figure 5H:
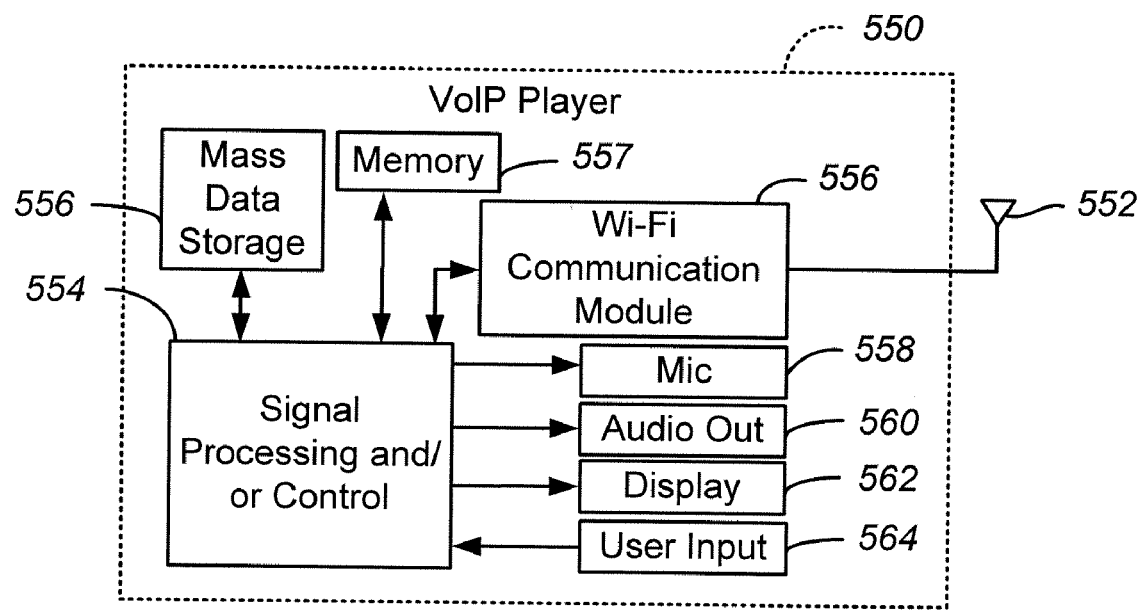
FIG. 5H is a block diagram of a voice over Internet Protocol (VOIP) telephone that may incorporate the quiescent current detecting circuit.

Referring to FIG. 5H, the present invention may be embodied in a Voice over Internet Protocol (VoIP) phone 550 that may include an antenna 552. The present invention may implement either or both signal processing and/or control circuits, which are generally identified in FIG. 9H at 554, a mass data storage 556 and memory 557 of the VoIP phone 550. In some implementations, VoIP phone 550 includes, in part, a microphone 558, an audio output 560 such as a speaker and/or audio output jack, a display monitor 562, an input device 564 such as a keypad, pointing device, voice actuation and/or other input devices, and a Wireless Fidelity (Wi-Fi) communication module 566. Signal processing and/or control circuits 554 and/or other circuits (not shown) in VoIP phone 550 may process data, perform coding and/or encryption, perform calculations, format data and/or perform other VoIP phone functions.

VoIP phone 550 may communicate with mass data storage 556 that stores data in a nonvolatile manner such as optical and/or magnetic storage devices, for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". VoIP phone 550 may be connected to memory 557, which may be a RAM, ROM, low latency nonvolatile memory such as flash memory and/or other suitable electronic data storage. VoIP phone 550 is configured to establish communications link with a VoIP network (not shown) via Wi-Fi communication module 556.

Taking advantage of the asymmetric current sourcing capability of the OTA and using a comparator to measure voltage divergence on the OTA inputs has applicability well beyond uses in class A/B amplifiers. The ability to accurately detect current over a range of operating conditions and process parameters while adding virtually no load to the circuit under test is a significant improvement over prior art current sensing techniques including series sensing resistors.

We claim:

1. An apparatus for facilitating sensing of current, comprising:
   a current sink configured to sink current proportional to a current to be sensed, the current sink coupled to a first circuit node;
   an operational transconductance amplifier (OTA) having an OTA output coupled to the first circuit node to source current to the current sink, the OTA having a first OTA input and a second OTA input, the first OTA input coupled to the first circuit node, the second OTA input coupled to a second circuit node, wherein the OTA is configured to source a maximum output current that is less than the current of the current sink; and
   a comparator with a first comparator input and a second comparator input coupled to the first and second OTA inputs respectively, wherein a comparator output is in a first state when the OTA output is sinking current or sourcing less than the maximum output current and the comparator output is in a second state when the OTA output is sourcing at least the maximum output current.

2. The apparatus of claim 1, wherein the current sink comprises a first transistor with a drain coupled to the first circuit node, a source coupled to ground and a gate coupled to the gate of a drive transistor, wherein a first current through the first transistor is proportional to a current through the drive transistor in the ratio of a gate width/length of the drive transistor to a gate width/length of the first transistor.

3. The apparatus of claim 2, further comprising a current source coupled to the first circuit node for adjusting the first current through the first transistor at which the comparator will change state.

4. The apparatus of claim 3, wherein the current source provides a fixed current and the first current at which the comparator will change state is known and the current through the drive transistor is varied until a change in comparator output state is observed to determine the quiescent current in the drive transistor.

5. The apparatus of claim 3, wherein the current source provides a known variable current and the first current is varied until a change is comparator output state is observed to determine the quiescent current in the drive transistor.

6. The apparatus of claim 2, wherein the drive transistor is part of an output stage of a class AB amplifier.

7. The apparatus of claim 1, wherein the second OTA input is coupled to the second comparator input through a resistor.

8. The apparatus of claim 1, wherein the maximum output current is set by a current source in the OTA.

9. The apparatus of claim 1, wherein the second OTA input is coupled to an output stage of a class AB amplifier.

10. The apparatus of claim 1, wherein the OTA comprises a source transistor configured as a current source of the maximum output current.

11. The apparatus of claim 10, wherein the OTA further comprises a bias current source and the source transistor supplies current proportional to the bias current source.

12. The apparatus of claim 10, wherein the OTA further comprises a sink transistor for sinking current at the OTA output, wherein a feedback mechanism that equalizes a voltage on the first and second OTA inputs fails when insufficient current is present in the sink transistor allowing the voltage on the first and second OTA inputs to diverge, causing a state change in the comparator output.

13. A method of sensing current utilizing a current sensing apparatus including a current sink coupled to a first circuit node, an operational transconductance amplifier (OTA) having an OTA output coupled to the first circuit node, the OTA having a first OTA input and a second OTA input, the first OTA input coupled to the first circuit node, the second input coupled to a second circuit node, wherein the OTA is configured to source from the OTA output a maximum output current that is less than the current of the current sink, the method comprising:
   drawing current from the output of the OTA through the current sink wherein when current drawn from the OTA output meets or exceeds the maximum output current of the OTA, a voltage divergence occurs between the first OTA input and the second OTA input;
   measuring the voltage divergence at the first and second OTA inputs when current drawn from the OTA output meets or exceeds the maximum output current of the OTA; and
   activating a signal when the voltage divergence meets a threshold.

14. The method of claim 13, wherein the current sensing circuit further includes a comparator with a first comparator input and a second comparator input coupled to the first and second OTA inputs respectively and activating a signal when the voltage divergence meets a threshold comprises changing an output state of the comparator when the voltage divergence causes a relative voltage change on the first and second comparator inputs.

15. The method of claim 13, wherein the current sensing circuit further includes an adjustable current source coupled to the first circuit node and the method further comprises adjusting the adjustable current source until the comparator output changes to the second state.

16. A method of sensing current utilizing a current sensing apparatus including a current sink configured to sink current proportional to a current to be sensed, the current sink coupled to a first circuit node, an operational transconductance amplifier (OTA) having an OTA output coupled to the first circuit node, the OTA having a first OTA input and a second OTA input, the first OTA input coupled to the first circuit node, the second input coupled to a second circuit node, wherein the OTA is configured to source a maximum output current that is less than the current of the current sink, and an adjustable current source coupled to the first circuit node, and a comparator with a first comparator input and a second comparator input coupled to the first and second OTA inputs respectively, the method comprising:
   (a) Setting the current of the adjustable current source to an initial current;
   (b) decrementing the current of the adjustable current source;
   (c) determining whether the output of the comparator changed states;
   (d) repeating acts (b) and (c) until it is determined that the output of the comparator changed states; and
   (e) calculating an approximation of the current to be sensed based on the current of the adjustable current source that resulted in the output of the comparator changing states.

17. The method of claim 16, further comprising setting the maximum output current of the OTA to a known maximum current using a current source in the OTA.

18. The method of claim 16, wherein calculating an approximation of the current to be sensed comprises adding the known maximum current of the OTA to the current of the adjustable current source that resulted in the output of the comparator changing states.

19. A class AB amplifier with integral quiescent current sensing capability comprising:

complementary PMOS and NMOS output transistors coupled between power and ground with a drive output at a connection between the complementary PMOS and NMOS output transistors;

an operational transconductance amplifier (OTA) having a non-inverting input coupled to the drive output, an inverting input and an OTA output each coupled to a first circuit node, the OTA output configured to source no more than a maximum output current;

a current sink coupled to the first circuit node and configured to sink current proportional to a current through the NMOS output transistor;

a comparator with a first comparator input and a second comparator input coupled to the non-inverting and inverting OTA inputs respectively, wherein a comparator output is in a first state when the current sink is sinking less than the maximum output current of the OTA and the comparator output is in a second state when the current sink is sinking the maximum output current from the OTA output.

20. The class AB amplifier of claim 19, further comprising a calibration current source coupled to the OTA output that supplements current sourced by the OTA output; wherein NMOS output transistor current is proportional to the sum of the calibration current and current sourced by the OTA output.

21. The class AB amplifier of claim 20, wherein the calibration current source provides a known variable current and is adjusted until the comparator changes state.

22. The class AB amplifier of claim 19, further comprising an offset circuit coupled to the non-inverting input of the OTA and the first input of the comparator to provide an offset voltage at the comparator when the non-inverting and inverting inputs of the OTA are at approximately equal voltages.

23. The class AB amplifier of claim 22, wherein the offset circuit comprises a resistor and current source providing a voltage shift between the non-inverting input of the OTA to the first input of the comparator.

24. The class AB amplifier of claim 19, further comprising a current source in the OTA, wherein the maximum output current of the OTA output is set by the current source in the OTA.

25. A current sensing circuit suitable for use in a class A/B amplifier comprising:

an output driver coupled to a sensing transistor, the output driver and sensing transistor having a known W/L ratio;

a dual input amplifier means having an asymmetric current output capability coupled to the sensing transistor, wherein sourcing more than a rated current from an output of the dual input amplifier through the sensing transistor will cause normally equal voltages on each input to diverge;

a voltage comparison means coupled to the inputs of the dual input amplifier and having an output that changes state when a current through the sensing transistor exceeds the rated current from the output of the dual input amplifier allowing the normally equal voltages on each input of the dual input amplifier to diverge, wherein current through the output driver is proportional to the rated current from the output in a known W/L ratio.

* * * * *